(12) United States Patent
Murad et al.

(10) Patent No.: US 8,860,120 B2
(45) Date of Patent: Oct. 14, 2014

(54) FIELD MODULATING PLATE AND CIRCUIT

(75) Inventors: Saad Kheder Murad, Kleve (DE); Ronaldus Johannus Martinus van Boxtel, Boekel (NL)

(73) Assignee: NXP, B.V., Eindhoven (NL)

( * ) Notice: Subject to any disclaimer, the term of this patent is extended or adjusted under 35 U.S.C. 154(b) by 12 days.

(21) Appl. No.: 13/238,722

(22) Filed: Sep. 21, 2011

(65) Prior Publication Data

US 2012/0068772 A1    Mar. 22, 2012

Related U.S. Application Data

(60) Provisional application No. 61/385,233, filed on Sep. 22, 2010.

(51) Int. Cl.
| | |
|---|---|
| *H01L 29/788* | (2006.01) |
| *H01L 29/66* | (2006.01) |
| *H01L 29/40* | (2006.01) |
| *H01L 29/778* | (2006.01) |
| *H01L 29/43* | (2006.01) |
| *H01L 27/02* | (2006.01) |

(52) U.S. Cl.
CPC ...... *H01L 29/7785* (2013.01); *H01L 29/66462* (2013.01); *H01L 29/402* (2013.01); *H01L 29/432* (2013.01); *H01L 27/0274* (2013.01)

USPC ........... 257/316; 257/192; 257/194; 257/195; 257/133; 257/368

(58) Field of Classification Search
USPC .................. 257/316, 192, 194–195, 368, 133
See application file for complete search history.

(56) References Cited

U.S. PATENT DOCUMENTS

| | | | |
|---|---|---|---|
| 6,242,293 B1 | 6/2001 | Danzilio | |
| 8,212,718 B2 * | 7/2012 | Utagawa et al. | 342/195 |
| 2002/0171096 A1 | 11/2002 | Wakejima et al. | |
| 2007/0228477 A1 * | 10/2007 | Suzuki et al. | 257/368 |
| 2009/0206363 A1 * | 8/2009 | Machida et al. | 257/133 |
| 2009/0230430 A1 * | 9/2009 | Miyamoto et al. | 257/192 |
| 2010/0102358 A1 * | 4/2010 | Lanzieri et al. | 257/194 |

* cited by examiner

*Primary Examiner* — Fernando L Toledo
*Assistant Examiner* — Mohammed Shamsuzzaman

(57) ABSTRACT

Consistent with various example embodiments, a field-controlling electrode applies a negative bias, relative to a source/drain electrode, increase voltage breakdown. The field-controlling electrode is located over a channel region and between source and drain electrodes, and adjacent a gate electrode. The field electrode shapes a field in a portion of the channel region laterally between the gate electrode and one of the source/drain electrodes, in response to a negative bias applied thereto.

22 Claims, 10 Drawing Sheets

FIELD MODULATING PLATE AND CIRCUIT

This patent document claims the benefit under 35 U.S.C. §119 of U.S. Provisional Patent Application Ser. No. 61/385,233, filed on Sep. 22, 2010, and which is fully incorporated herein by reference.

Various embodiments of the present disclosure relate to the use of a field-controlling plate (e.g., electrode) in a circuit such as a transistor.

The electronics industry continues to rely upon advances in semiconductor technology to realize higher-function devices in more compact areas. For many applications, realizing higher-functioning devices requires integrating a large number of electronic devices into a single silicon wafer. As the number of electronic devices per given area of the silicon wafer increases, the manufacturing process becomes more difficult.

Many varieties of semiconductor devices have been manufactured having various applications in numerous disciplines. Such silicon-based semiconductor devices often include field-effect transistors (FETs) such as metal-oxide-semiconductor field-effect transistors (MOSFET), which may be implemented as p-channel MOS (PMOS), re-channel MOS (NMOS) and complementary MOS (CMOS) transistors, bipolar transistors, and/or BiCMOS transistors. Such MOSFET devices include an insulating material between a conductive gate and silicon-like substrate; therefore, these devices are generally referred to as IGFETs (insulated-gate FET). Another type of semiconductor device is a pseudomorphic heterojunction electron mobility (pHEMT) FET that permits electron flow to occur in an un-doped channel layer so that the electron mobility is not affected by impurity scattering.

Such semiconductor devices often include a semiconductor substrate on which a number of active devices are formed. The particular structure of a given active device can vary between device types. For example, in MOS transistors, an active device generally includes source and drain regions and a gate electrode that modulates current between the source and drain regions.

Furthermore, such devices may be digital or analog devices produced in a number of wafer fabrication processes, for example, CMOS, BiCMOS, Bipolar, etc. The substrates may be silicon, gallium arsenide (GaAs) or other substrate suitable for building microelectronic circuits thereon.

The operating frequencies in which semiconductor devices are expected to function is ever increasing. Furthermore, the operating voltage of these devices is being pushed down. For example, low breakdown voltages can limit a device's maximum operating voltage. Moreover, in many amplifier designs, it is desirable to achieve high output power over a wide frequency bandwidth with low distortion, such as for a radio frequency (RF) signal. For example, within community antenna television (CATV) amplifiers it is desirable to have very low distortion over a wide frequency range. In CATV amplifiers, the supply voltage is often 24 V, yet voltage bias may be limited to a lower voltage (e.g., 12V). Approaches to addressing these voltage limitations have been challenging to adequately implement, as circuit designs can be complicated, and the resulting circuit efficiency can be compromised, which can lead to a distortion and low bandwidth.

These characteristics have presented challenges to the design and implementation of devices with adequate breakdown voltages and operating frequencies, as well as low operating voltages.

The present disclosure addresses various challenges, including those discussed above, and as may relate to a variety of circuits, such as radio frequency (RF) or microwave compound semiconductor field effect transistors (FET) and pseudomorphic high electron mobility field effect transistor (pHEMTs), and the operating voltage of these devices.

In accordance with an example embodiment a circuit includes a gate electrode over a channel region and between source and drain electrodes, a field electrode between the gate electrode and the drain electrode, and a control circuit connected to the field electrode and the source electrode. The gate electrode is configured with the channel region to apply an electric field to the channel region for controlling the conductivity of the channel region between the source and drain electrodes. The field electrode is separated from the channel region by a distance greater than a separation between the gate electrode and the channel region. The control circuit is configured with the field electrode and the channel region to bias the field electrode negatively relative to the source electrode, and to shape an electric field in a portion of the channel region laterally between the gate electrode and the drain electrode. In this context, the field plate can be used to increase the breakdown voltage of the channel region relative, for example, to the breakdown voltage absent the field plate and/or with the field plate biased with the source region (or, e.g., with the gate).

Another example embodiment is directed to an amplifier circuit including source and drain electrodes separated by a channel region, a gate electrode over the channel region and between the source and drain electrodes, a field electrode between the gate electrode and the drain electrode, and a control circuit connected to the field electrode. The gate electrode is configured and arranged with the channel region to apply an electric field to the channel region in response to a signal applied to the gate electrode, and therein control conductivity of the channel region between the source and drain electrodes, and generate an amplified version of the signal applied to the gate. The field electrode is separated from the channel region by a distance greater than a separation between the gate electrode and the channel region, and is configured and arranged with the channel region to shape an electric field in the channel region in response to a negative bias applied to the field electrode. The control circuit is configured and arranged, with the field electrode and the channel region, to negatively bias the field electrode relative to the source electrode and shape an electric field in a portion of the channel region laterally between the gate electrode and the drain electrode, and therein increase the breakdown voltage of the channel region.

Another example embodiment is directed to a method for controlling a semiconductor device having a gate electrode over a channel region and between source and drain electrodes, and a field electrode over the channel region and laterally between the gate electrode and the drain electrode. The gate electrode is biased to apply an electric field to the channel region and control conductivity of the channel region between the source and drain electrodes. A negative bias is applied to the field electrode, relative to a bias at the source electrode, to shape a field in a portion of the channel region laterally between the gate electrode and the drain electrode.

Still other aspects of the present disclosure are directed to a method for fabricating a FET or pHEMT, and to fabricating such devices with a high breakdown voltage and linearity for RF applications.

The above summary is not intended to represent each disclosed embodiment, or every aspect, of the present invention. Other aspects and example embodiments are provided in the figures and the detailed description that follow.

The disclosure may be more completely understood in consideration of the detailed description of various embodiments of the disclosure that follows in connection with the accompanying drawings, in which.

Figure 1:
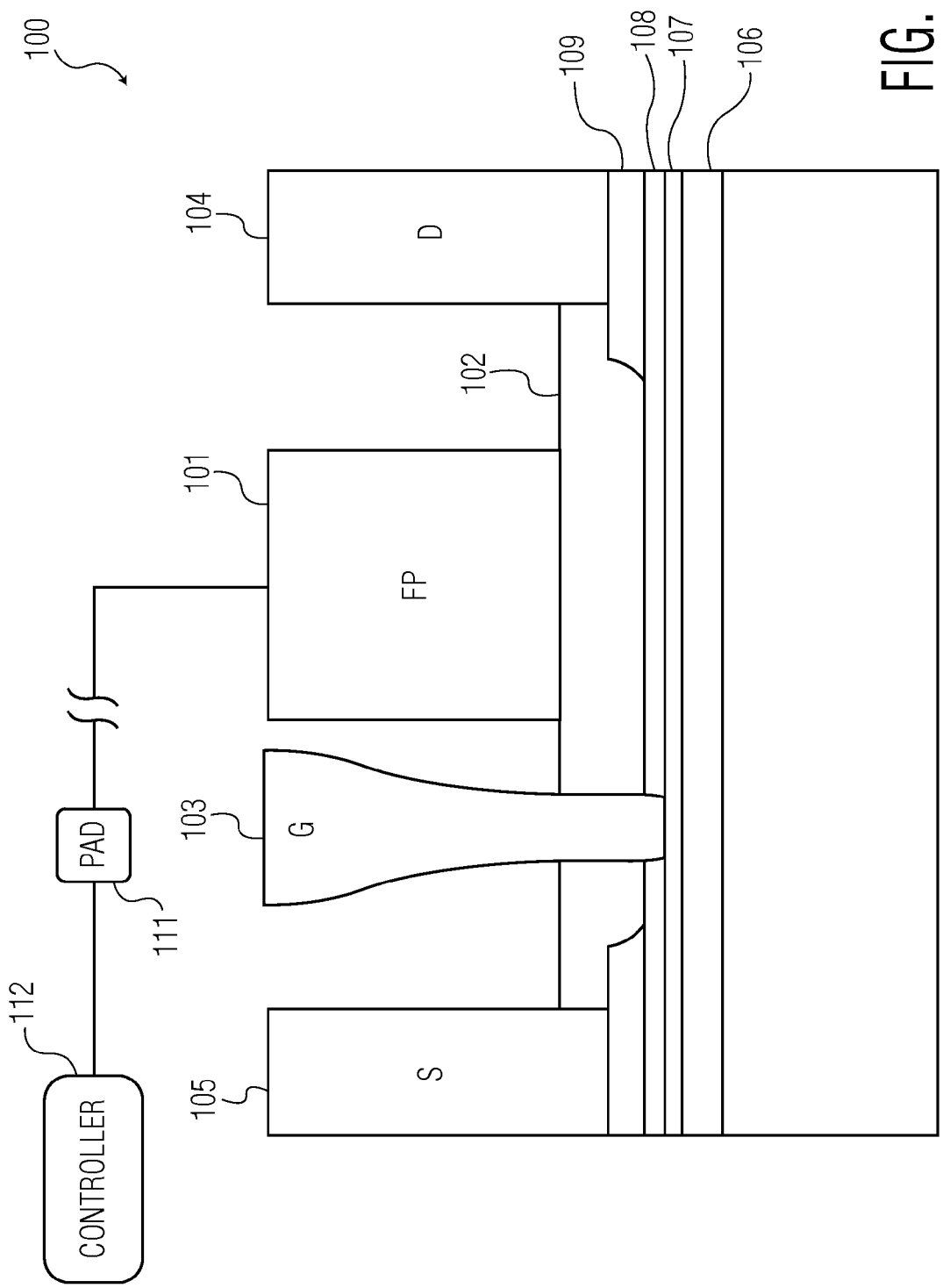
FIG. 1 shows an independently biased field control plate between the gate and drain contact, according to an example embodiment of the disclosure.

While the disclosure is amenable to various modifications and alternative forms, examples thereof have been shown by way of example in the drawings and will be described in detail. It should be understood, however, that the intention is not to limit the disclosure to the particular embodiments shown and/or described. On the contrary, the intention is to cover all modifications, equivalents, and alternatives falling within the spirit and scope of the disclosure.

The present invention is believed to be applicable to a variety of different types of circuits, devices and systems for and/or involving circuits, such as FETs, having a field plate as discussed herein. While the present invention is not necessarily limited in this context, various aspects of the invention may be appreciated through a discussion of related examples.

Various aspects of the present disclosure are directed to FETs and/or pHEMT circuits that can be implemented with high voltages, such as may be present in CATV amplifier circuits. A field plate electrode (or simply, field electrode) is located between a gate electrode and a source/drain electrode, and configure for negative bias relative to the source/drain electrode, for controlling a channel field. In connection with one or more embodiments as discussed herein, it has been discovered that such an approach can be used to enhance/increase a breakdown voltage of the channel, facilitating high-voltage application. In specific implementations, such a field electrode is implemented with an RF amplifier circuit, and enhances device linearity and power capabilities via the reduction of drain current dispersion along the a channel as discussed above.

Other aspects of the present disclosure are directed to pHEMT-based amplifier circuits for operation at high voltage (e.g., 20V). The circuits include a field plate electrode configured (e.g., via a control/bias circuit) for application of a field to an underlying channel at a bias that is different from a bias applied to a source region, therein reducing hot electrons at a surface of the device. This approach can be used to improve device reliability and protect the device during RF overdrive testing or RF overdrive incidents.

In a more particular example embodiment, a FET device such as a pHEMT or other heterostructure FET includes a field electrode biased separately, independently from a source/drain to set or otherwise effect a desirable voltage breakdown of a channel in the FET device. The device includes a semi-insulating GaAs substrate and multiple layers on the substrate. The multiple layers include: a buffer layer of GaAs/AlAs, a lower insulating layer of AlGaAs on the buffer layer, a lower Si sheet of layer doping charge on the lower insulating layer, a first spacer layer of AlGaAs on the lower sheet of Si, a pseudomorphic high mobility layer of InGaAs on the first spacer layer, a second spacer layer of AlGaAs on the pseudomorphic high mobility layer, an upper sheet layer of doping charge in Si on the second spacer layer, an upper insulating layer of AlGaAs on the upper sheet layer, a first transition layer of GaAs on the upper insulating layer, a second etch stop layer of AlAs on the upper sheet layer, a second transition layer of GaAs on the second etch stop layer, a first etch stop layer of AlAs on the second transition layer, and a cap layer of highly doped GaAs. The device includes a first recess defined having a depth to the second transition layer from the surface of the cap layer, and separated by a first width of the first recess, portions of the cap layer and underlying first etch stop layer are defined as a source and a drain. A second recess is defined having a depth to the surface of the first transition layer, the second recess depth greater than the first recess depth, and a second recess width less than the first recess width, the second recess located nearer to the source than the drain. On the first transition layer, a conductive gate is patterned within the second recess, with the conductive gate width being less than that of the second recess. A first passivation layer covers the conductive gate, with the passivation layer having openings defined for the source and drain. A metal field plate is patterned on the first passivation layer and at a distance from the conductive gate and within bounds of the first recess.

In another embodiment, a circuit includes a pHEMT transistor over a GaAs substrate, and having a buffer layer, a channel layer, at least one spacer layer, at least one donor layer, a barrier layer (e.g., a Schottky layer), etch stop layers and a cap layer. The barrier layer may be doped to function as both the barrier layer and the donor layer. The spacer and the barrier layers are formed of wide band gap semiconductor material such as AlGaAs. The channel and the cap layers are grown from a narrow band gap semiconductor, such as InGaAs or GaAs.

The pHEMT transistor further includes gate, source, drain and field plate electrodes, over the aforesaid channel layer. The field plate is configured, for application of a negative bias, relative to a voltage applied at the source electrode, to control a conductivity aspect of the channel region. Specifically, the pHEMT transistor exhibits a discontinuity in energy gaps between the wide-band gap semiconductor donor layer and the narrow band gap channel layer causes the electron to remain in the channel layer, but very close to the hetero junctions because of the electrostatic attraction from the donor atoms. Conduction therefore takes place in the (undoped) channel layer with high electron mobility, as the mobility is not affected by the impurity scattering. The field plate electrode is located between the gate electrode and the drain electrode, relatively closer to the gate electrode, and controls a conductivity condition of the channel region, and therein enhances the gate-drain breakdown voltage. In some implementations, the field plate decreases hole injection from the channel region to the barrier layer and/or depletes hot electrons from adjacent an edge of the gate electrode.

Turning now to the figures, FIG. 1 shows a FET-type device 100 with an independently-controlled field plate 101 (field plate electrode), in accordance with another example embodiment. The field plate 101 is placed on top of a dielectric layer 102 (e.g., SiN) that covers a gate electrode 103, and is located between the gate electrode and a drain electrode 104, with a source electrode 105 being opposite the gate electrode.

The FET-type device 100 further includes a channel region 106, over which the field plate 101 and gate electrode 103 are located to respectively apply a bias to the channel region. The channel region 106 may include one or more different components/layers as may be implemented for different types of FETs, such as a generally dopant-free channel portion as well as one or more carrier donor layers that form a channel region of a heterojunction FET. Separating the channel region 106 from a gate is a semi-insulating semiconductor layer 107 (e.g., including GaAs), with the gate being formed in a gap defined by laterally adjacent regions of a transition layer 108 (e.g., as formed by creating an opening in the transition layer). A highly-doped transition layer 109 (e.g., doped GaAs) is over the transition layer 108, and also has separated portions thereof laterally adjacent a region over which both the field plate 101 and gate electrode 103 are located.

The field plate 101 is configured to respond to a bias that is independent from a voltage applied to the drain electrode 104, to control a depth that hot electrons are pushed from a surface adjacent the gate 103, without depleting a channel in the channel region 106 under the field plate. The field plate 101 is also responsive to a bias that is negative, relative to the source 105, to deplete hot electrons from the vicinity of the gate electrode 103 close to the field plate and also from under the field plate. The gate 103 can also be biased separately and/or independently from the bias applied to the field plate. This approach can also be used to reduce the capacitance between the gate and drain, and to facilitate linearity via the reduction of drain current dispersion in the channel region 106, using the field plate 101. This approach may further be implemented in a design stage, to facilitate the reduction of the dependence of $C_{gd}$ and $C_{ds}$ with $V_d$, by suppressing the fields around the gate edge via independent application of a voltage to the field plate.

In some implementations, the device 100 also includes a biasing pad 111, coupled to the field plate 101 and further to a control circuit (e.g., controller 112) that applies an independent bias to the field plate. The bias applied can be a DC bias or an RF bias, to suit different applications. In certain implementations, an RF choke is placed in the path of an RF signal that may flow through the field plate 101 to a virtual ground between the pad 111 and the field plate.

Figure 2:
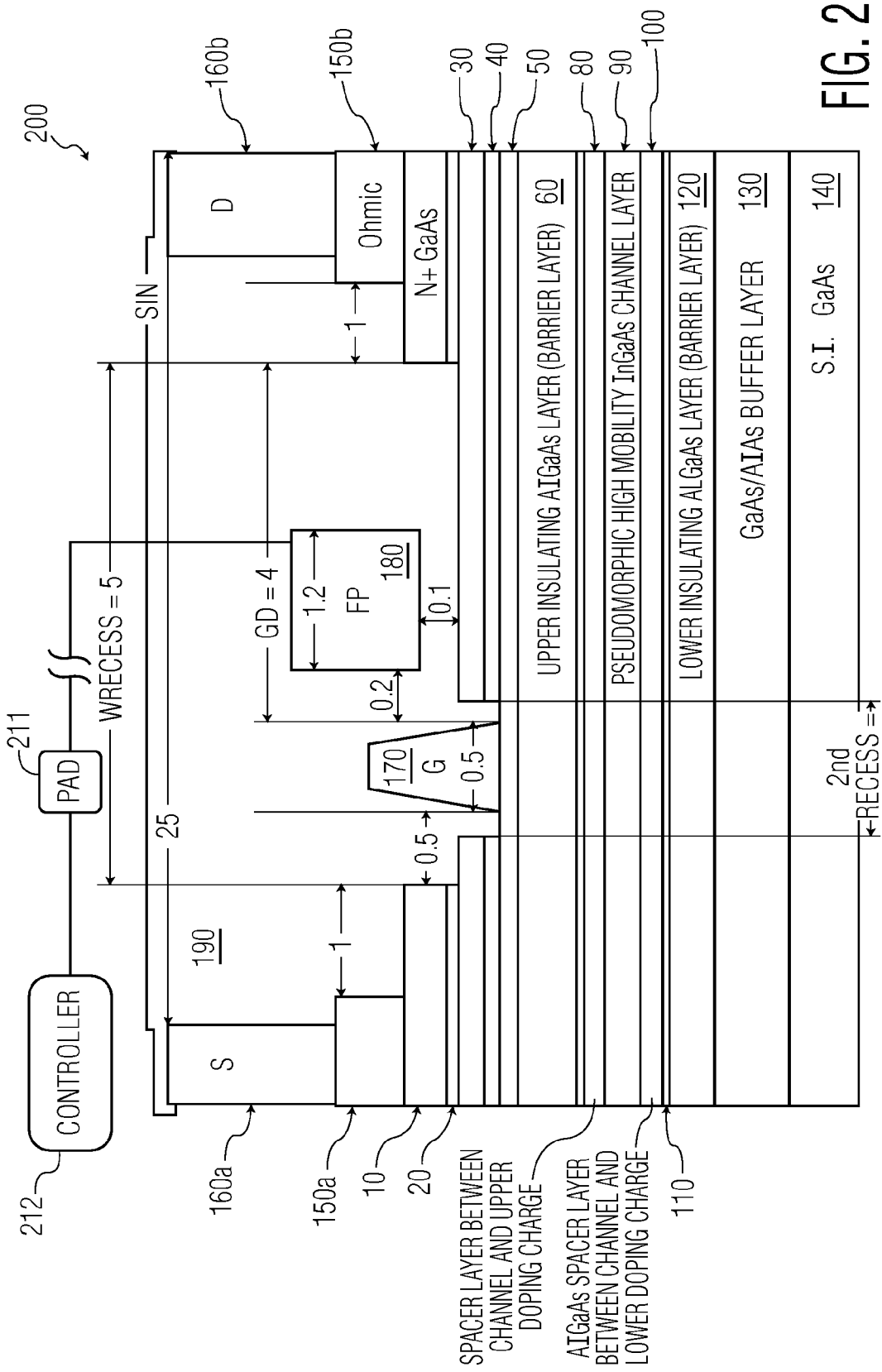
FIG. 2 is a cross-sectional view of a high-breakdown voltage pHEMT device according to another example embodiment of the disclosure.

Referring now to FIG. 2, a more detailed example of a FET-type circuit 200 is shown fabricated on GaAs substrate, with channel region layers for a pseudomorphic high electron mobility transistor (pHEMT), in accordance with another example embodiment. The circuit 200 includes a gate 170 and field plate 180 respectively formed in recessed openings between a source region 150a/160a and a drain region 150b/160b. The field plate 180 is configured with the gate 170 and underlying channel region (discussed below) to apply a field that increases the breakdown voltage of the circuit 200, and may also facilitate desirable linearity and transistor efficiency.

The circuit 200 can be implemented using a variety of materials and material/layer configurations. By way of example, Table 1 describes an embodiment with specific compositions, layer thicknesses and doping characteristics of the various materials and layers as shown in FIG. 2.

TABLE 1

Layer Structure for Example High Breakdown pHEMT Device

| Layer | Thickness (Å) | Doping | Composition | Function |
|---|---|---|---|---|
| 10 | 350 | $5 \times 10^{18}$ cm$^{-3}$ | GaAs | Highly-doped GaAs cap/transition layer for S/D ohmics |
| 20 | 15 | | AlAs | Etch stop layer |

TABLE 1-continued

Layer Structure for Example High Breakdown pHEMT Device

| Layer | Thickness (Å) | Doping | Composition | Function |
|---|---|---|---|---|
| 30 | 200 | | GaAs | GaAs (transition) layer partially removed by gate recess |
| 40 | 15 | | AlAs | Etch stop layer for gate recess |
| 50 | 50 | | GaAs | GaAs layer below gate metallization |
| 60 | 250 | | Al$_{0.24}$Ga$_{0.76}$As | Upper insulating AlGaAs (barrier) layer (e.g., a Schottky layer) |
| 70 | — | $5 \times 10^{12}$ cm$^{-2}$ | Si | Upper Si doping charge layer |
| 80 | 40 | | Al$_{0.24}$Ga$_{0.76}$As | Spacer layer |
| 90 | 150 | | In$_{0.15}$Ga$_{0.85}$As | Pseudomorphic high-mobility InGaAs (2DEG) layer |
| 100 | 40 | | Al$_{0.24}$Ga$_{0.76}$As | Spacer layer |
| 110 | — | $1 \times 10^{12}$ cm$^{-2}$ | Si | Lower Si doping charge layer |
| 120 | 300 | | Al$_{0.4}$Ga$_{0.6}$As | Lower insulating (barrier) AlGaAs layer |
| 130 | 10× (20/200) | $5 \times 10^{16}$ cm$^{-3}$ | GaAs/AlAs | Buffer layer |
| 140 | | | | Semi-insulating GaAs Substrate |

Accordingly, the channel/substrate layers in the circuit 200 are over a buffer layer 130, which is on a semi-insulating GaAs support layer 140. The buffer layer 130 may, for example, include pairs (e.g., ten) of GaAs/AlGaAs layers of about 20 Å and about 200 Å, respectively, and doped at about $5 \times 10^{16}$ cm$^{-3}$.

The channel/substrate layers include a lower barrier layer 120 on the buffer layer 130, and a Si sheet charge donor layer 110 on the lower barrier layer. A channel layer 90 (e.g., an InGaAs layer, a 2 DEG layer) is sandwiched between upper and lower spacer layers 80 and 100, respectively between the charge donor layer 110 and another Si sheet charge donor layer 70. An upper barrier layer 60 is on the charge donor layer 70.

The gate 170 is over a gate layer 50, and in a gap/recess defined by a transition layer 30, with an etch stop layer 40 that is between the transition layer and the gate layer 50 and that facilitates etching of the transition layer 30 to form the gap/recess in which the gate is located. Another etch stop layer 20 is on the transition layer 30, and a highly-doped transition/cap layer 10 in on the etch stop layer 20, facilitates etching of the transition layer 10 to form the gap/recess in which both of the gate 170 and the field plate 180 are located. The source/drain regions 160a and 160b, and/or any separate aspects of the ohmic regions 150a and 150b, are located on the transition layer 10. A SiN dielectric layer 190 is also between the source/drain regions, within the respective gaps/recesses and covering the gate electrode 170, with the field plate 180 over a portion of the SiN layer.

In accordance with various implementations, during operation of the circuit 200, pHEMT breakdown first starts below an edge of the gate 170 that is closer to the drain 160b, at which a highest field is applied. At breakdown, drain current flows from the drain 160b to the gate 170 as hole current (due to the generation of electron hole pairs), collected at the gate and with breakdown occurring, for example, due to large signal operation or an instantaneous signal coupled to the gate 170. A light emission may be observed at the location of the onset of the breakdown. When the device is pinched off (e.g., when the gate voltage is lower than the threshold voltage), the gate 170 and drain 160b become isolated from the source 160a, and the breakdown characteristics are determined by a voltage difference between the drain and the gate.

When the channel layer 90 is open, the breakdown characteristics become a strong function of drain or channel current ($I_{DS}$) or gate voltage ($V_{GS}$). Breakdown may occur, for example, due to the formation of a dipole layer behind the depletion layer near the drain 160b, which absorbs some of the voltage across the drain and the gate 170 and eases the field accumulation near the gate edge, which further increases the total voltage drop between the gate the drain before the transistor experiences breakdown. The voltage drop across the dipole layer can be increased by increasing the total drain-source distance, the distance between the gate 170 and the drain 160b, provided that the gate is still capable of modulating the channel current, this in turn will increase the overall breakdown voltage between the gate and the drain. The field plate 180 also enhances the breakdown further, and can be effected with little or no affect upon RF performance.

Various distances of features shown in the circuit 200 are indicated in the figure by way of an example embodiment. For example, the field plate 180 can be placed about 2 to 3 μm from the edge of the drain 160b and about 0.25 to 1 μm from the edge of the gate 170. The field plate 180 is placed on a dielectric layer 190 of SiN with a thickness of about 0.1 to about 0.5 μm. The first recess (wide recess) is about 5 um, as defined from the N$^+$GaAs areas on layer 10 that define the source 150a and drain 150b. The second recess has a width of about 0.5 μm, or about the same width as the gate 170. Though the gate width may be smaller than the second recess width. The distance from the gate 170 to the edge of the wide recess is about 4 μm.

In one implementation, the field plate 180 is connected to the gate 170 and kept at the same potential as the gate to reduce the field accumulation and channel modulation. In another implementation, the field plate 180 is independently controlled but in concert with field on the source electrode 160a, in such way that the field plate is negatively biased with respect to the source electrode, to facilitate control of the field shape between the gate 170 and the drain 160b.

Figure 3:
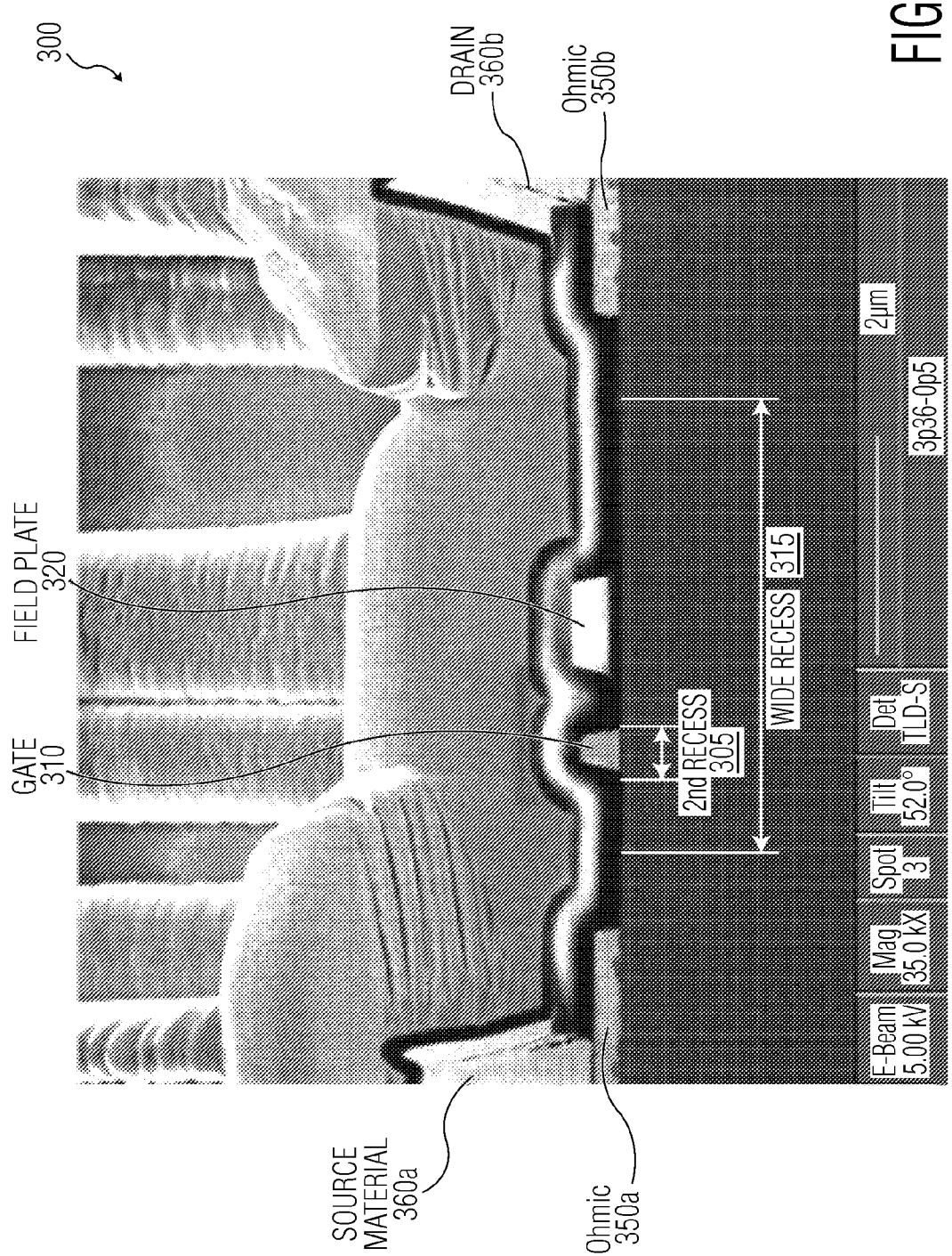
FIG. 3 is a SEM cross-section of the device depicted in FIG. 2, in accordance with another example embodiment.

FIG. 3 shows a Scanning Electron Micrograph (SEM) cross-section 300 of a pHEMT device, which may be implemented as the device depicted in FIG. 2, in accordance with another embodiment. A field plate 320 and gate 310 are situated in the, and first recess ("wide recess" as labeled in the SEM photograph) 315, and second recess 305, respectively. The gate 310 and field plate 320 are located between source and drain regions 360a and 360b, which are respectively formed on an ohmic material 350a and 350b. The gate 310 is situated on an etch stop layer, such as discussed in connection with FIG. 2, and the field plate 320 is situated on a dielectric 360 that is over the gate 310 (e.g., applied after definition of the gate). Depending upon the particular application, the field plate 320 may be coupled to an independently adjustable bias source or to the gate 310, or to metallization at source 360a or drain 360b (which cover the ohmic contacts 350a and 350b, respectively).

Figure 4:
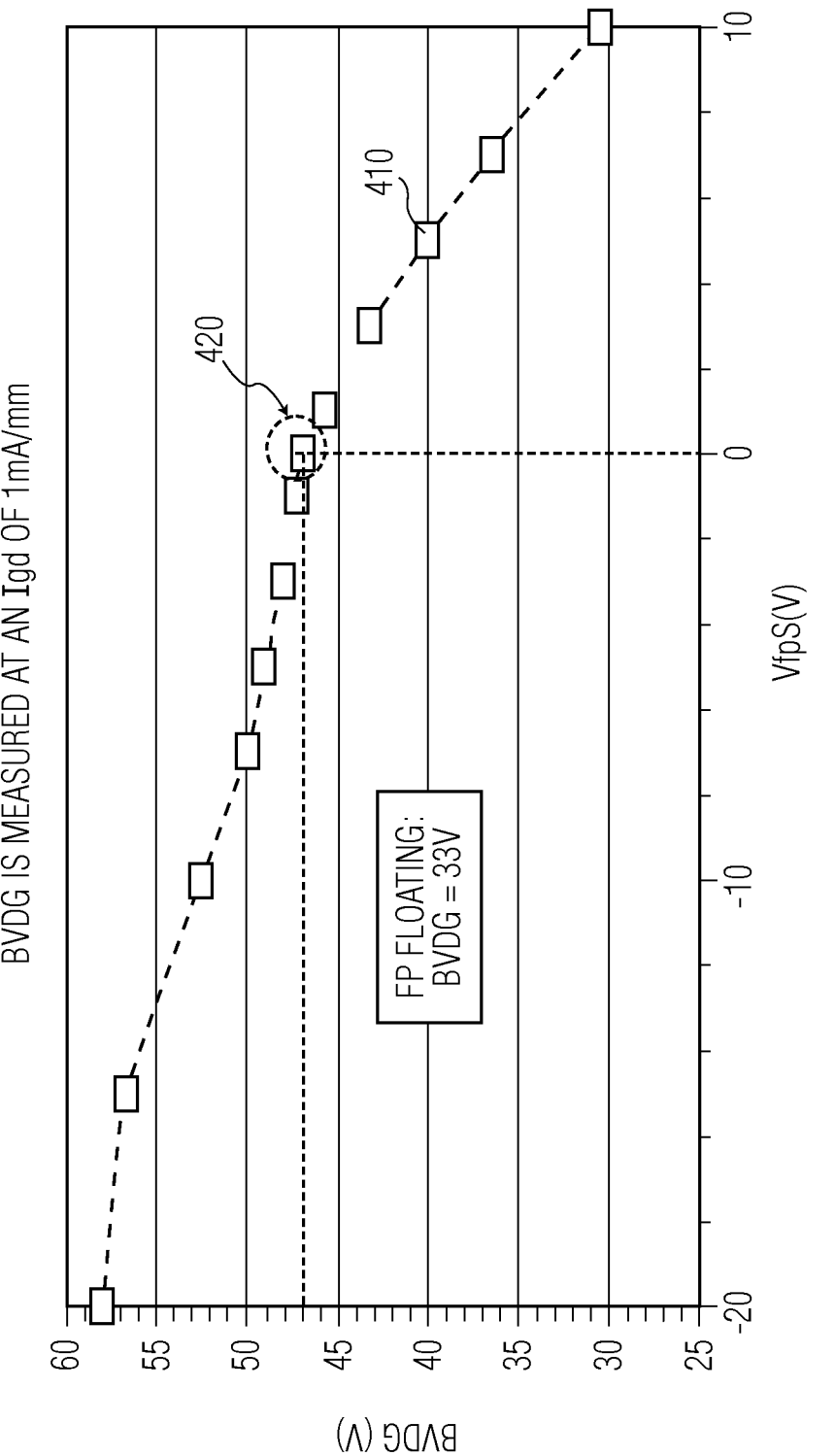
FIG. 4 is a plot of gate-drain breakdown voltage (BVDG) as function of voltage between the field plate and the source of the pHEMT structure according to another example embodiment of the disclosure.

FIG. 4 is plot of gate-drain breakdown voltage (BVDG) as function of voltage between a field plate and a source of a pHEMT structure, according to another example embodiment. The plot shown in FIG. 4 may, for example, be implemented in connection with the one or both of the circuits as shown in FIGS. 1 and 2. Plot 410 shows an increasing $BV_{DG}$ as the $V_{FPS}$ becomes more negative. With the field plate floating (not connected), the $BV_{DG}$ is about 33 v. With the field plate at zero volts, the $BV_{DG}$ is about 48 v. At a $V_{FPS}$ of –20 v, the $BV_{DG}$ is about 60 v, and at a $V_{FPS}$ of 10 v the $B_{VDG}$ is about 30 v. In addition to enhancing $BV_{DG}$ as $V_{FPS}$ becomes more negative, the capacitances of the device are reduced which enhances the $F_t$ and linearity of the device as higher voltages can be applied for the same output power.

Figure 5:
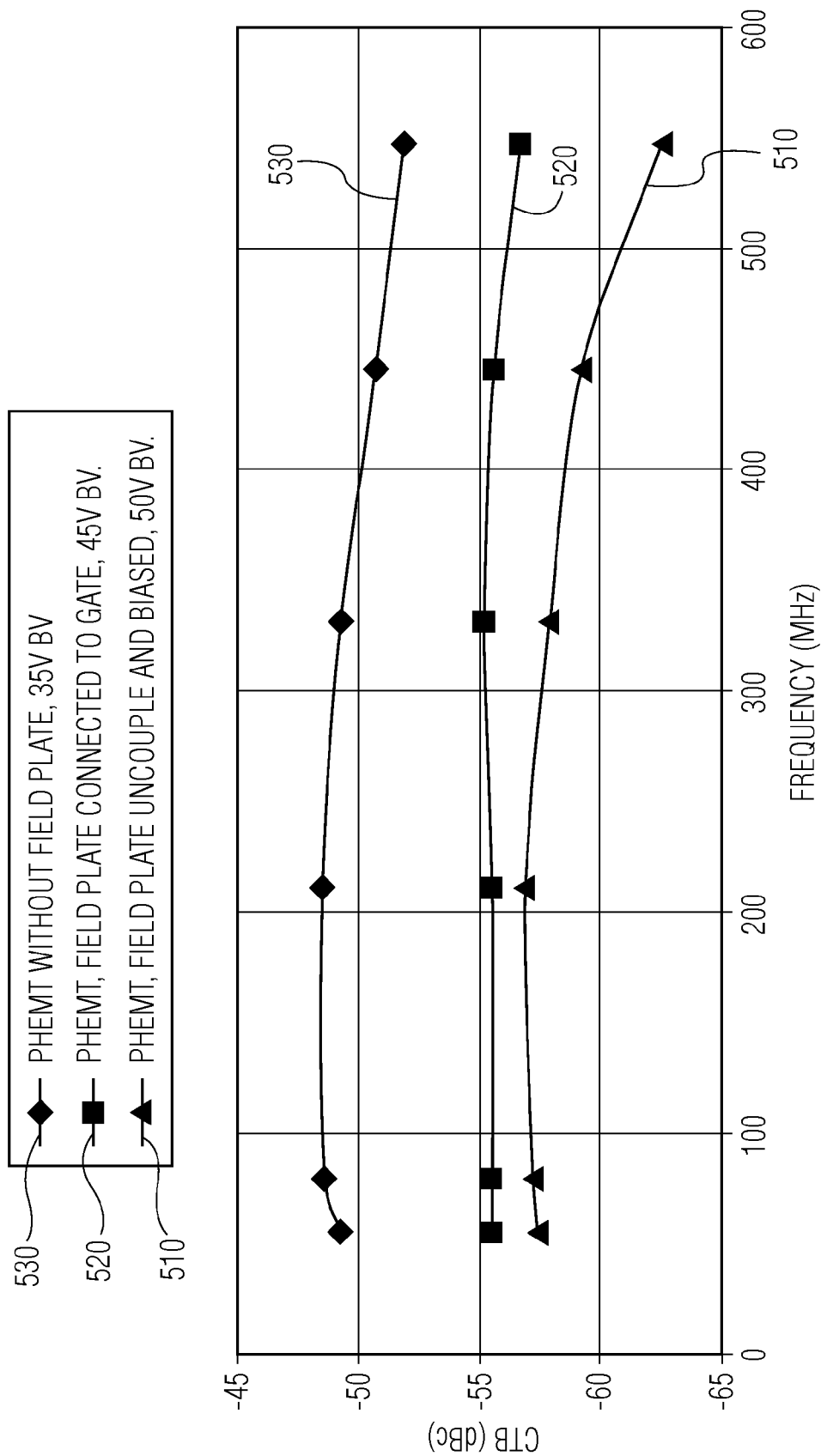
FIG. 5 is a plot of CTB ("composite third-order beat") distortion performance for a CATV gain block with and without field plate design for a pHEMT according to another example embodiment of the disclosure.

FIG. 5 is a plot of CTB ("composite third-order beat"—indicative of distortion) versus Frequency (MHz) operation for a gain block (e.g., for CATV and/or base station application), with and without field plate design for a pHEMT, according to another example embodiment. In this context, CTB can be related to a line over which a signal is transmitted, and to traffic being transmitted over the line, such as for cable television and/or cable Internet. In many CATV distortion measurements, in a broad sense, CTB is a measure of how well television channels are separated from one another; the more negative the CTB value, the better the distortion or channel isolation. Plot 510 shows a pHEMT having a field plate uncoupled via an external capacitor and biased, in which $BV_{DG}$ is about 50 v at a current of 420 mA. Plot 520 is a pHEMT having an end stage field plate connected to a gate, in which $BV_{DG}$ is about 45 v at a current of 410 mA. Plot 530 is a pHEMI end stage without a field plate, in which $BV_{DG}$ is about 35 v at current of 420 mA. As may be implemented with various embodiments (and related discoveries), the $BV_{DG}$ is enhanced in the pHEMT having the field plate. Furthermore, the CTB performance has a flatter slope for curves 520 and 530, as the CTB distortion does not increase as much at the higher frequencies.

FIGS. 6A-6E show cross-sections of a pHEMT device 600 at various stages of manufacture, according to another example embodiment. Various pHEMT devices such as discussed herein may be fabricated in part or whole using an approach such as shown in FIGS. 6A-6E. Beginning with FIG. 6A, upon a substrate 610, a "mesa" structure 620 of a pHEMT is prepared, and ohmic metal 630 is deposited. This substrate 610 may, for example, correspond to the bottom layer 140 of the substrate shown in FIG. 2.

Figure 6A:
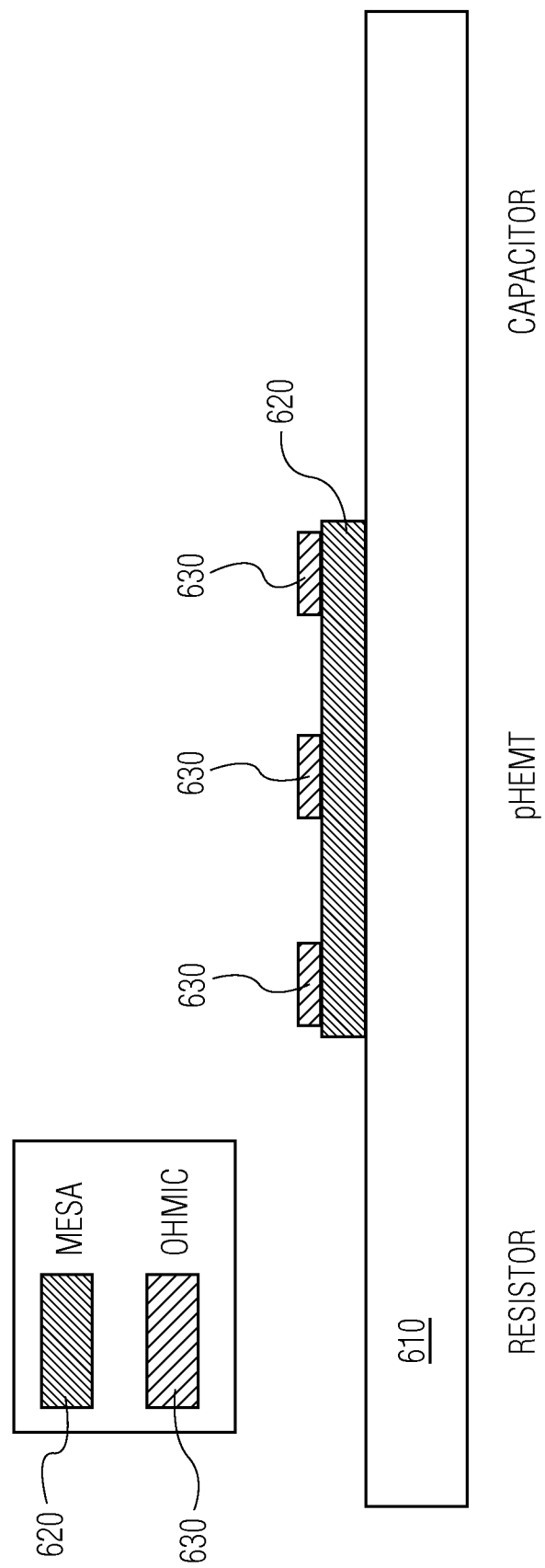
FIGS. 6A-6E show cross-sections of steps for forming a field-plate structure in a pHEMT, according to another example embodiment of the present disclosure.
Figure 6B:
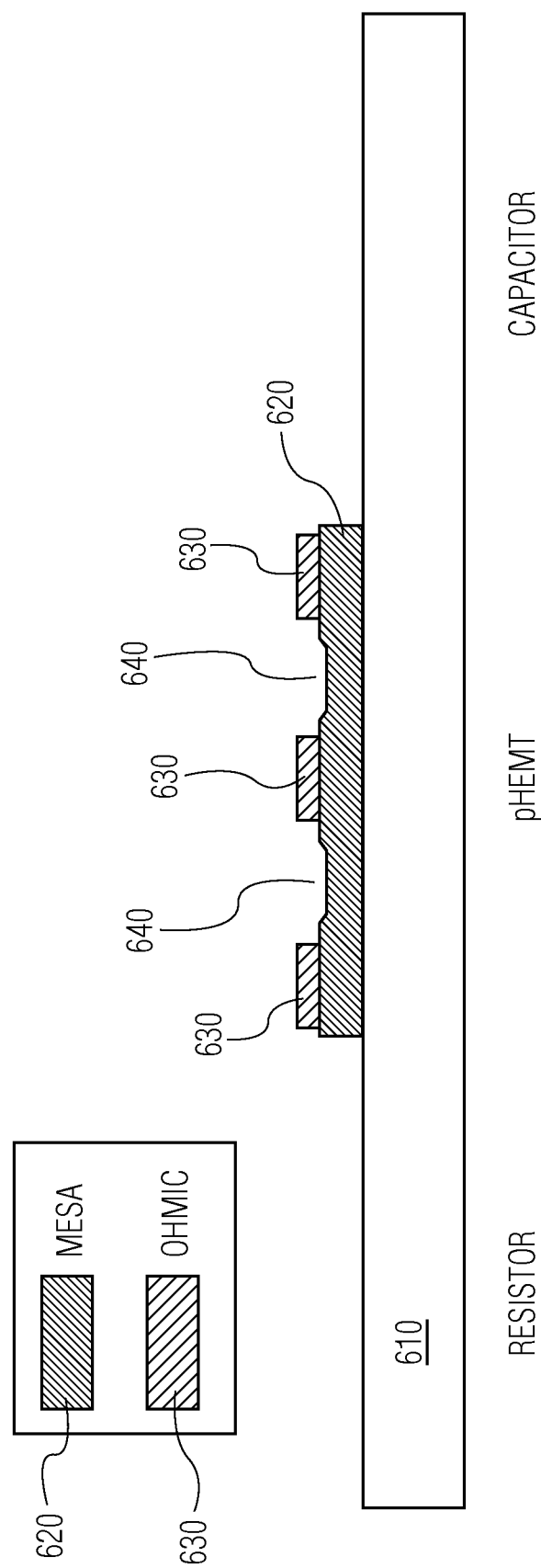
Figure 6C:
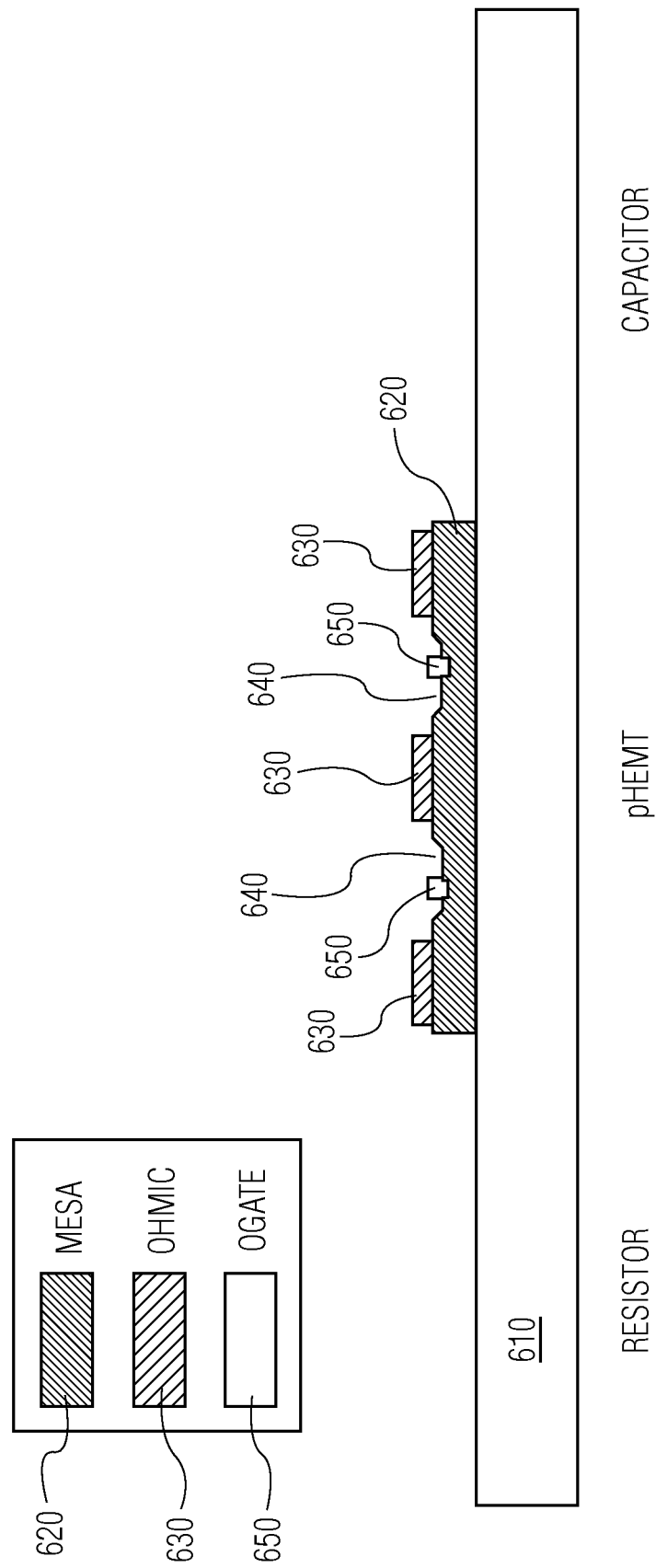
Figure 6D:
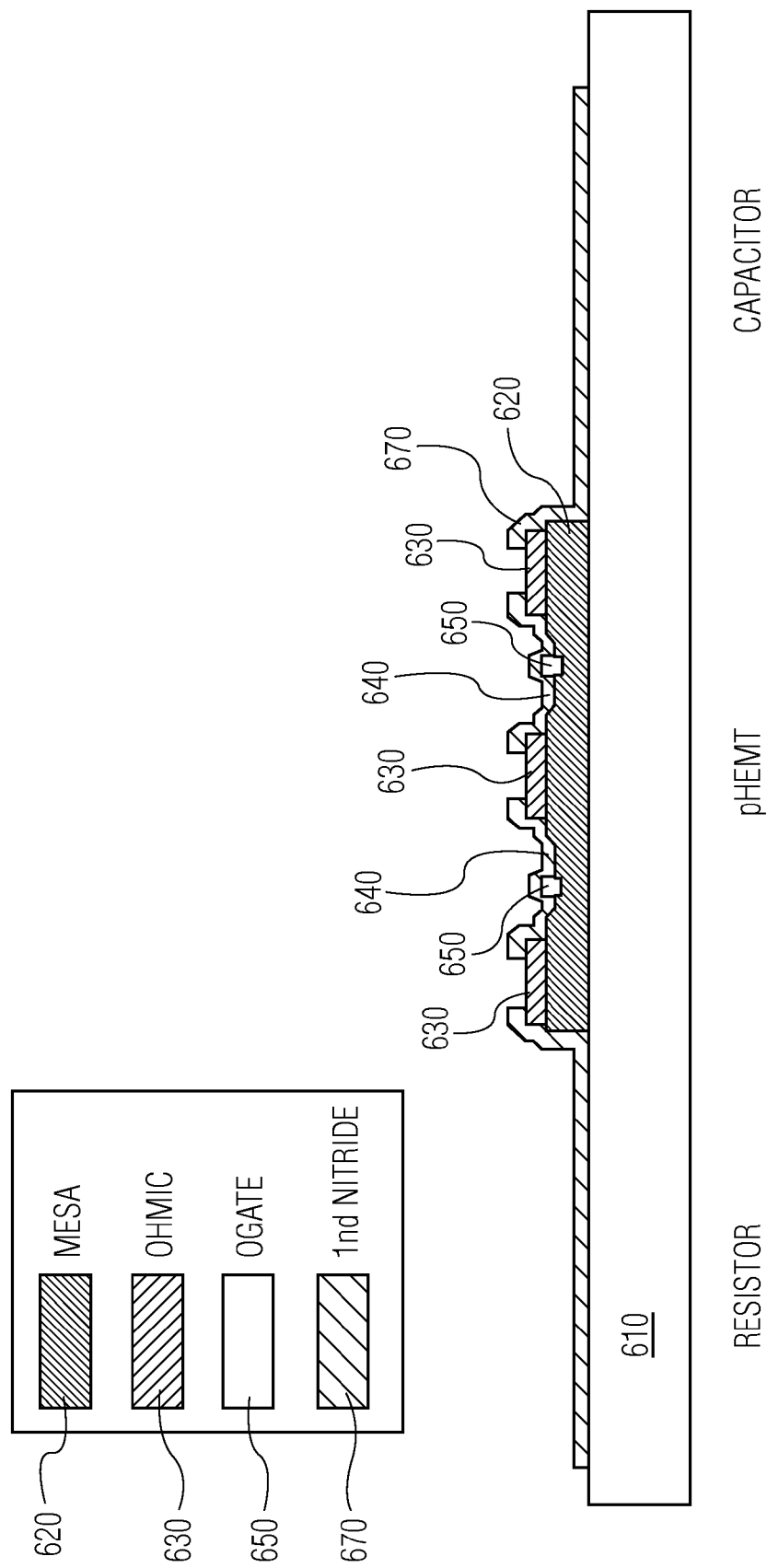
Figure 6E:
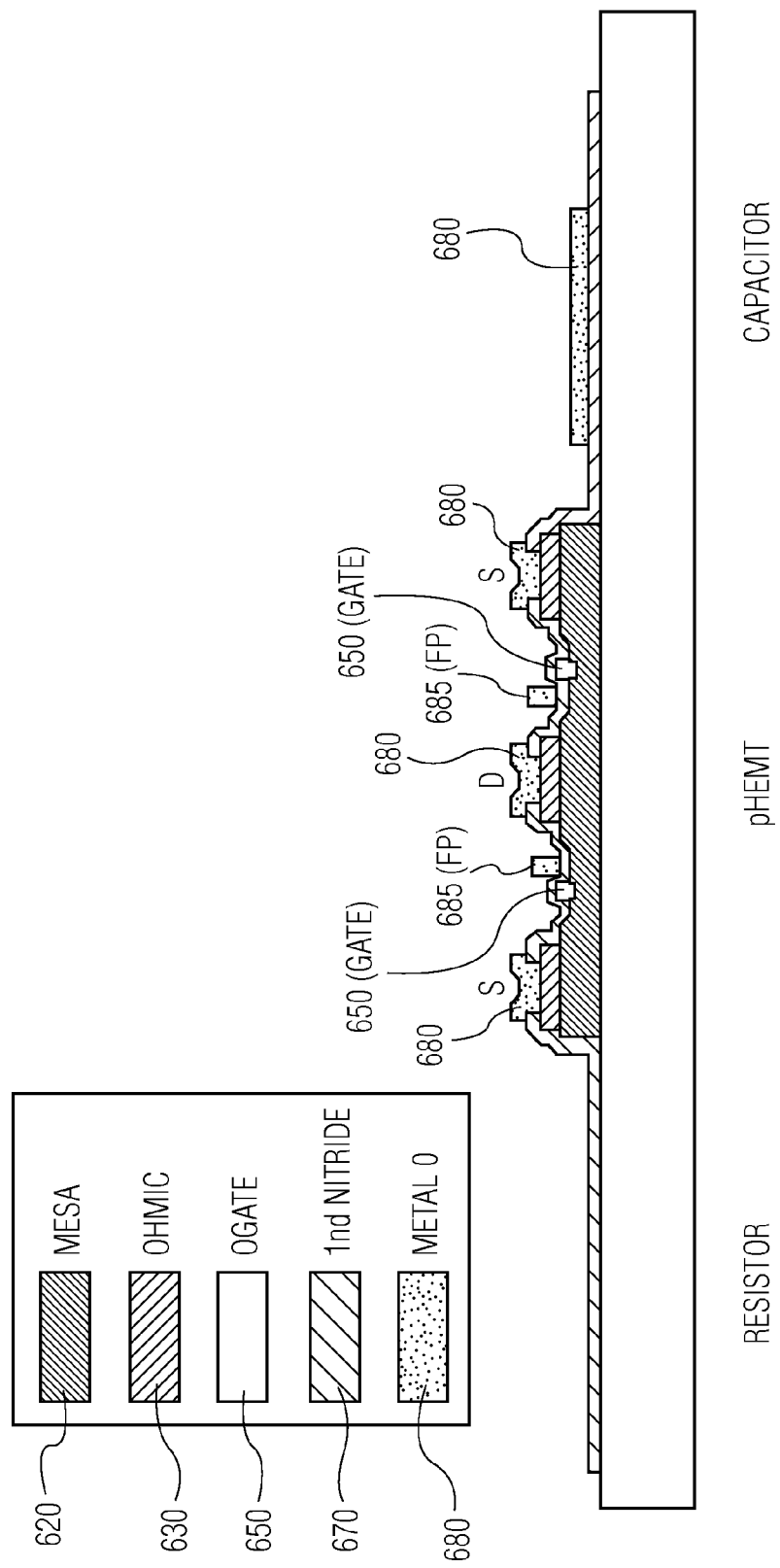

On the substrate 610, locations for passive components such as resistors and capacitors may be defined as well. As shown in FIG. 6B, a first recess ("wide recess") 640 is defined. Referring to FIG. 6C, a second recess is defined and a conductive gate 650 is applied therein. As shown in FIG. 6D, after the gate 650 has been defined, a first nitride layer 670 deposited. The areas for the source, gate, and drain terminals of the pHEMT are defined. The passive components are covered with nitride 670, as well. Referring to FIG. 6E, metallization 680 is applied to the source, drain, and capacitor areas over the substrate 610. Field plates 685 are also defined with metallization 680. The ohmic gates 650 are electrically connected, as are the sources and drain of the pHEMT transistor. Further connection can be made between the field plates 685 and a controller, such as shown in FIGS. 1 and 2, for controlling the bias of the field plates 685 relative to the source.

Based upon the above discussion and illustrations, those skilled in the art will readily recognize that various modifications and changes may be made to the present invention without strictly following the exemplary embodiments and applications illustrated and described herein. For example, the spacing of components such as the field plates, gates and channel regions can be adjusted to suit particular applications. Such modifications do not depart from the true spirit and scope of the present invention, including that set forth in the following claims. Furthermore, the term "example" as used throughout this document is by way of illustration, and not limitation.

The invention claimed is:

1. A circuit comprising:
   a gate electrode over a channel region and between source and drain electrodes, the gate electrode being configured and arranged with the channel region to apply an electric field to the channel region and control conductivity of the channel region between the source and drain electrodes;
   at least one semiconductor layer arranged including ohmic regions, having ohmic material, disposed under the source and drain electrodes in the at least one semiconductor layer;
   a field electrode between the gate electrode and the drain electrode and separated from the channel region by a distance greater than a separation between the gate electrode and the channel region; and
   a control circuit connected to the field electrode and the source electrode, the control circuit being configured and arranged with the field electrode and the channel region to bias the field electrode negatively relative to the source electrode and to shape an electric field in a portion of the channel region laterally between the gate electrode and the drain electrode.

2. The circuit of claim 1, wherein the field electrode is configured and arranged with the gate electrode to respond to the negative bias by depleting hot electrons from adjacent an edge of the gate facing the field electrode and from under the field electrode, and wherein the channel region is un-doped and the ohmic regions of the at least one semiconductor layer are highly-doped as compared to the channel region, and the channel region is configured arranged to provide conduction in the channel region with high electron mobility that is not affected by impurity scattering.

3. The circuit of claim 1, wherein
   the field electrode is configured and arranged with the gate electrode to respond to the negative bias by depleting hot electrons from adjacent an edge of the gate facing the field electrode and from under the field electrode; and
   the control circuit is connected to the gate and configured and arranged to apply a bias to the gate that is different than the negative bias applied to the field electrode.

4. The circuit of claim 1, further including:
   a first GaAs layer over the channel region;
   a second GaAs layer over the first GaAs layer, the second GaAs layer having respective portions laterally adjacent the gate electrode and defining a first gap exposing the first GaAs layer, the gate electrode being on the first GaAs layer in the first gap, and
   a doped GaAs layer over the second GaAs layer, the doped GaAs layer having respective portions laterally adjacent both the gate electrode and the field electrode and defining a second gap, at least the gate electrode being in the second gap.

5. The circuit of claim 1, further including first and second semiconductor layers over the channel region, the second semiconductor layer being on the first semiconductor layer and having a discontinuity therein defining a gap that extends to the first semiconductor layer, the gate electrode being in the gap and on the first semiconductor layer between portions of the second semiconductor layer, the gate electrode having a width that is less than a width of the gap, the field electrode being over the second semiconductor layer.

6. The circuit of claim 5, further including a dielectric layer covering the gate electrode and the second semiconductor layer, the field electrode being on a portion of the dielectric layer laterally adjacent the gate electrode.

7. The circuit of claim 5, wherein the field electrode is laterally between respective portions of a transition layer respectively between the source and the second layer and between the gate and the second layer.

8. The circuit of claim 5, wherein the field electrode is laterally between respective portions of a transition layer respectively between the source and the second layer and between the gate and the second layer, the respective portions of the transition layer being laterally separated by a distance that is at least five times the distance across the gap.

9. The circuit of claim 1, further including a dielectric layer covering the gate electrode and extending laterally adjacent the gate electrode and over the channel region, the field electrode being on a portion of the dielectric layer laterally adjacent the gate electrode.

10. The circuit of claim 1, wherein the field electrode is laterally spaced from the gate by a distance that is less than half of a lateral distance between the field electrode and the drain.

11. The circuit of claim 1, further including upper and lower semiconductor layers respectively over and under the channel region and being configured and arranged to donate electrons to the channel region, the gate electrode and field electrodes being over the upper semiconductor layer.

12. The circuit of claim 1, further including
   a charge-donor layer adjacent the channel region and configured and arranged to donate charge to the channel region,
   a first GaAs-based layer over the charge-donor layer,
   a second GaAs-based layer over the first GaAs-based layer, the second GaAs-based layer having respective portions laterally adjacent the gate electrode and defining a first gap exposing the first GaAs-based layer, the gate electrode being on the first GaAs-based layer in the first gap, and
   a doped GaAs layer over the second GaAs-based layer, the doped GaAs layer having respective portions laterally adjacent the field electrode defining a second gap, the field electrode being in the second gap.

13. The circuit of claim 1, further including
   a spacer layer including AlGaAs, the channel region being adjacent the spacer layer and including a pseudomorphic high mobility material having InGaAs,
   a charge donor layer configured and arranged to donate charge carriers to the channel region,
   a first GaAs-based layer over the spacer layer, the charge donor layer and the channel region,
   a second GaAs-based layer over the first GaAs-based layer, the second GaAs-based layer having respective portions laterally adjacent the gate electrode and defining a first gap exposing the first GaAs-based layer, the gate electrode being on the first GaAs-based layer in the first gap, and
   a doped GaAs layer over the second GaAs-based layer, the doped GaAs layer having respective portions laterally adjacent the field electrode defining a second gap, the field electrode being in the second gap.

14. An amplifier circuit comprising:
   source and drain electrodes separated by a channel region;
   a gate electrode over the channel region and between the source and drain electrodes, the gate electrode being configured and arranged with the channel region to apply an electric field to the channel region in response to a signal applied to the gate electrode, and therein control conductivity of the channel region between the source and drain electrodes and generate an amplified version of the signal applied to the gate;

at least one semiconductor layer arranged including ohmic regions, having ohmic material, disposed under the source and drain electrodes in the at least one semiconductor layer;

a field electrode between the gate electrode and the drain electrode and separated from the channel region by a distance greater than a separation between the gate electrode and the channel region, the field electrode being configured and arranged with the channel region to shape an electric field in the channel region in response to a negative bias applied to the field electrode; and a control circuit connected to the field electrode and configured and arranged, with the field electrode and the channel region, to negatively bias the field electrode relative to the source electrode and shape an electric field in a portion of the channel region laterally between the gate electrode and the drain electrode, and therein increase breakdown voltage of the channel region.

15. The circuit of claim 14, wherein the control circuit is configured and arranged with the field electrode to apply a negative bias to the field electrode and therein deplete hot electrons from adjacent an edge of the gate facing the field electrode, and wherein the channel region is un-doped and the ohmic regions of the at least one semiconductor layer are highly-doped as compared to the channel region, and the channel region is configured arranged to provide conduction in the channel region with high electron mobility that is not affected by impurity scattering.

16. The circuit of claim 14, wherein the control circuit is connected to the gate and configured and arranged to apply a bias to the gate that is different than the negative bias applied to the field electrode, and is configured and arranged with the field electrode to apply a negative bias to the field electrode and therein deplete hot electrons from adjacent an edge of the gate facing the field electrode.

17. The circuit of claim 14, further including:
a first GaAs layer over the channel region;
a second GaAs layer over the first GaAs layer, the second GaAs layer having respective portions laterally adjacent the gate electrode and defining a first gap exposing the first GaAs layer, the gate electrode being on the first GaAs layer in the first gap,
a doped GaAs layer over the second GaAs layer, the doped GaAs layer having respective portions laterally adjacent both the gate electrode and the field electrode and defining a second gap, at least the gate electrode being in the second gap.

18. A method for controlling a semiconductor device having a gate electrode over a channel region and between source and drain electrodes, and a field electrode over the channel region and laterally between the gate electrode and the drain electrode the method comprising:
biasing the gate electrode to apply an electric field to the channel region and control conductivity of the channel region between the source and drain electrodes; and
applying a negative bias to the field electrode, relative to a bias at the source electrode by a control circuit connected to the field electrode and the source electrode, to shape a field in a portion of the channel region laterally between the gate electrode and the drain electrode.

19. The circuit of claim 1, wherein
the control circuit is configured and arrange to bias the field electrode with a bias voltage that is negative relative to the source electrode; and
the field electrode is configured and arranged to, in response to the bias voltage, control a depth that hot electrons are pushed from a surface adjacent the gate electrode without depleting a channel in the channel region under the field electrode, and wherein the field electrode is further configured and arranged to deplete the hot electrons from the gate electrode and the channel region in response to the bias voltage.

20. The circuit of claim 19, wherein the gate electrode is further configured and arranged to be biased with a voltage that is different from the bias voltage provided to the field electrode, and wherein the circuit further comprises:
a biasing pad coupled to the field electrode and configured and arranged to apply the bias voltage to the field electrode; and
an RF choke circuit communicatively coupled in a signal path from the field electrode to a virtual ground between the biasing pad and the field electrode.

21. A circuit comprising:
gate electrode, over a channel region and between source and drain electrodes, for applying an electric field to the channel region and for controlling conductivity of the channel region between the source and drain electrodes;
at least one semiconductor layer arranged including ohmic regions, having ohmic material, disposed under the source and drain electrodes in the at least one semiconductor layer;
field plate, between the gate electrode and the drain electrode and separated from the channel region by a distance greater than a separation between the gate electrode and the channel region, for shaping an electric field in a portion of the channel region laterally between the gate electrode and the drain electrode channel region in response to a bias voltage; and
control circuitry, connected to the field plate and the source electrode, for biasing the field plate negatively relative to the source electrode and for shaping the electric field in the portion of the channel region.

22. The method of claim 18, further including at least one semiconductor layer arranged including ohmic regions, having ohmic material, disposed under the source and drain electrodes in the at least one semiconductor layer, wherein the channel region is un-doped and the ohmic regions of the one semiconductor layer are highly-doped as compared to the channel region, and the channel region is configured arranged to provide conduction in the channel region with high electron mobility that is not affected by impurity scattering.

* * * * *